United States Patent [19]

Woodall

[11] Patent Number: 5,550,951
[45] Date of Patent: Aug. 27, 1996

[54] METRICS FOR SPECIFYING AND/OR TESTING NEURAL NETWORKS

[75] Inventor: Roger L. Woodall, Jewett City, Conn.

[73] Assignee: The United States of America as represented by the Secretary of the Navy, Washington, D.C.

[21] Appl. No.: 33,225

[22] Filed: Mar. 18, 1993

[51] Int. Cl.$^6$ .............................. G06E 1/00; G06E 3/00; G06F 15/18
[52] U.S. Cl. ........................ 395/21; 395/24; 364/551.01
[58] Field of Search ................................ 395/21, 22, 23, 395/24; 364/551.01, 578, 579

[56] References Cited

U.S. PATENT DOCUMENTS

| | | | |
|---|---|---|---|
| 4,094,307 | 6/1978 | Young, Jr. ............................... | 128/731 |
| 4,912,647 | 3/1990 | Wood ....................................... | 345/23 |
| 5,164,912 | 11/1992 | Osborne et al. ...................... | 364/551.01 |

OTHER PUBLICATIONS

On Testing Iterated neural network Structures A. Moore et al. 10–12 Mar. 1991 IEEE, Int Conf on Computer design. Testing of Analog Neural Array–Processor Chips W–J. Hsu et al IEEE 14–16 Oct. 1991, Int. Conf. on Computer design.

*Primary Examiner*—Allen R. MacDonald
*Assistant Examiner*—Richemond Dorvil
*Attorney, Agent, or Firm*—Michael J. McGowan; Prithvi C. Lall; Michael F. Oglo

[57] ABSTRACT

A method for testing a neural network, and apparatus for carrying out the method. A first embodiment of the method includes the steps of (a) providing a neural network having a set of connection values, (b) stimulating at least one input of the neural network with an input vector to obtain output signals at an output of the neural network, (c) obtaining a plurality of samples of the output signals, wherein at least one of the plurality of samples is delayed in time from another one of the samples, and wherein at least one of the plurality of samples may represent a difference between two samples, (d) generating an image from the plurality of samples, and (e) comparing the image to a reference image to determine an operational characteristic of the neural network. The step of generating generates an image that is comprised of a plurality of points, wherein each of the points is referenced to an x-y coordinate system, wherein a distance along the x-axis is a function of a value of the output of the neural network for a given input vector applied to a first input of the neural network, and wherein a distance along the y-axis is function of a value of the output of the neural network for the given input vector applied a second input of the neural network.

20 Claims, 17 Drawing Sheets

0.667 GAIN                    OUTPUT vs PHASE 2
                                   for TRACE 7 b:tranpr47.dat                         INPUT 55.00

0.667 GAIN                   OUTPUT vs. ALL PHASES
                                   for TRACE 7 b:tranpr47.dat                         INPUT 55.00

2.000 GAIN — OUTPUT N vs. OUTPUT B — INPUT 55.00

0.667 GAIN — OUTPUT vs. DELAY 1 — b:tranpr47.dat — INPUT 55.00

METRICS FOR SPECIFYING AND/OR TESTING NEURAL NETWORKS

The invention described herein may be manufactured and used by or for the Government of the United States of America for governmental purposes without the payment of any royalties thereon or therefor.

BACKGROUND OF THE INVENTION

1. Field of the Invention

This invention relates generally to neural networks and, in particular, to methods and apparatus for testing the performance, and specifying the characteristics of, neural networks.

2. Description of the Prior Art

A large amount of literature exists in the field of artificial neural networks, or "neural nets". As one example, reference is made to Volumes 1 and 2 of "Parallel Distributed Processing-Explorations in the Microstructure of Cognition" by David E. Rumelhart, James E. McClelland and the PDP Research Group, The MIT Press, Cambridge, Mass. (1986). Reference is also made to U.S. Pat. No. 4,897,811, "N-Dimensional Coulomb Neural Network Which Provides For Cumulative Learning of Internal Representations" issued Jan. 30, 1990 to C. L. Scofield. This patent references a number of publications that describe various learning algorithms for multi-layer neural networks. Of particular interest herein are techniques for testing and/or specifying neural networks. A conventional technique, or metric, for testing a neural network sequentially presents the neural network with all examples of specific network accept and reject criteria, and then records the response of the neural network to each of the these inputs. However, the use of this technique may present a problem with large data sets, in that a considerable amount of time is required to present the entire data set to the network under test. Furthermore, as neural networks are embodied within trained hardware modules, the requirement for a sensitive metric becomes more important so as to adequately test the networks.

Neural network specifications for design applications consist primarily of connection weight values, architecture organization, and models of processing element(s). This is generally satisfactory for computer emulations. However, to accurately translate the specification into a hardware model, an additional requirement of design verification is presented.

As such, a problem arises when specialized neural network circuits are to be built and mass produced. The problem relates to both the specification of, and to the efficient testing, of the neural network.

Thus, an object of this invention is to provide an efficient metric for both testing and specifying a neural network.

SUMMARY OF THE INVENTION

The foregoing and other problems are overcome and the object of the invention is realized by a method for testing a neural network, and by apparatus for carrying out the method. A first embodiment of the method includes the steps of (a) providing a neural network having a set of connection values, (b) stimulating at least one input of the neural network with an input vector to obtain output signals at an output of the neural network, (c) obtaining a plurality of samples of the output signals, wherein at least one of the plurality of samples is delayed in time from another one of the samples, and wherein at least one of the plurality of samples may represent a difference between two samples, (d) generating an image from the plurality of samples; and (e) comparing the image to a reference image to determine an operational characteristic of the neural network.

The step of generating generates an image that is comprised of a plurality of points, wherein each of the points is referenced to an x-y coordinate system, wherein a distance along the x-axis is a function of a value of the output of the neural network for a given input vector applied to a first input of the neural network, and wherein a distance along the y-axis is function of a value of the output of the neural network for the given input vector applied a second input of the neural network.

The step of stimulating includes the steps of generating a time varying voltage potential, and successively applying a given value of the time varying voltage potential to each of the inputs of the neural network.

A second embodiment of the method (a) provides a neural network having a set of connection values, (b) stimulates at least one input of the neural network with an input vector to obtain an output signal at an output of the neural network, (c) obtains at least one sample of the output signal, (d) generates an image from the at least one sample of the output signal and from the input vector, and (e) compares the image to a reference image to determine an operational characteristic of the neural network.

BRIEF DESCRIPTION OF THE DRAWINGS

The above set forth and other features of the invention are made more apparent in the ensuing detailed description of the invention when read in conjunction with the attached Drawings, wherein:

FIG. 1d is a simplified schematic diagram that illustrates the operation of the multiplexer of FIG. 1a.

DESCRIPTION OF THE PREFERRED EMBODIMENT

This invention employs a realization that any neural network, that has at least one nonlinear processing element and connective weights of unique values, can be specified and/or tested by a conformance of the network to a spatial image(s). This spatial image, whether real (displayed) or virtual (non-displayed), can be compared for conformance to a predetermined "known-good" image by various processes, such as visual inspection or point by point comparison by a digital data processor. This invention provides a technique for generating spatial, nonlinear images for conformal comparisons. The resulting developed metric can be employed as part of the neural network's overall specification and/or quality test program.

Four similar neural networks are employed herein to describe the invention. A first neural network, referred to herein as a primary neural network, is used to plot various nonlinear images produced with differing test methods. A secondary neural network is used to demonstrate the technique's similarities and differences. A third exemplary neural network differs from the primary neural network only in that one or more of the constituent processing elements (PEs) include an internal threshold. More particularly, the third neural network is a modification of the primary neural network and includes a constant signal value that is added to an output of a processing element located within a hidden layer. The fourth exemplary neural network is also similar to the primary neural network except that outputs are taken at a hidden layer, which thus becomes a new output layer.

Figure 1A:
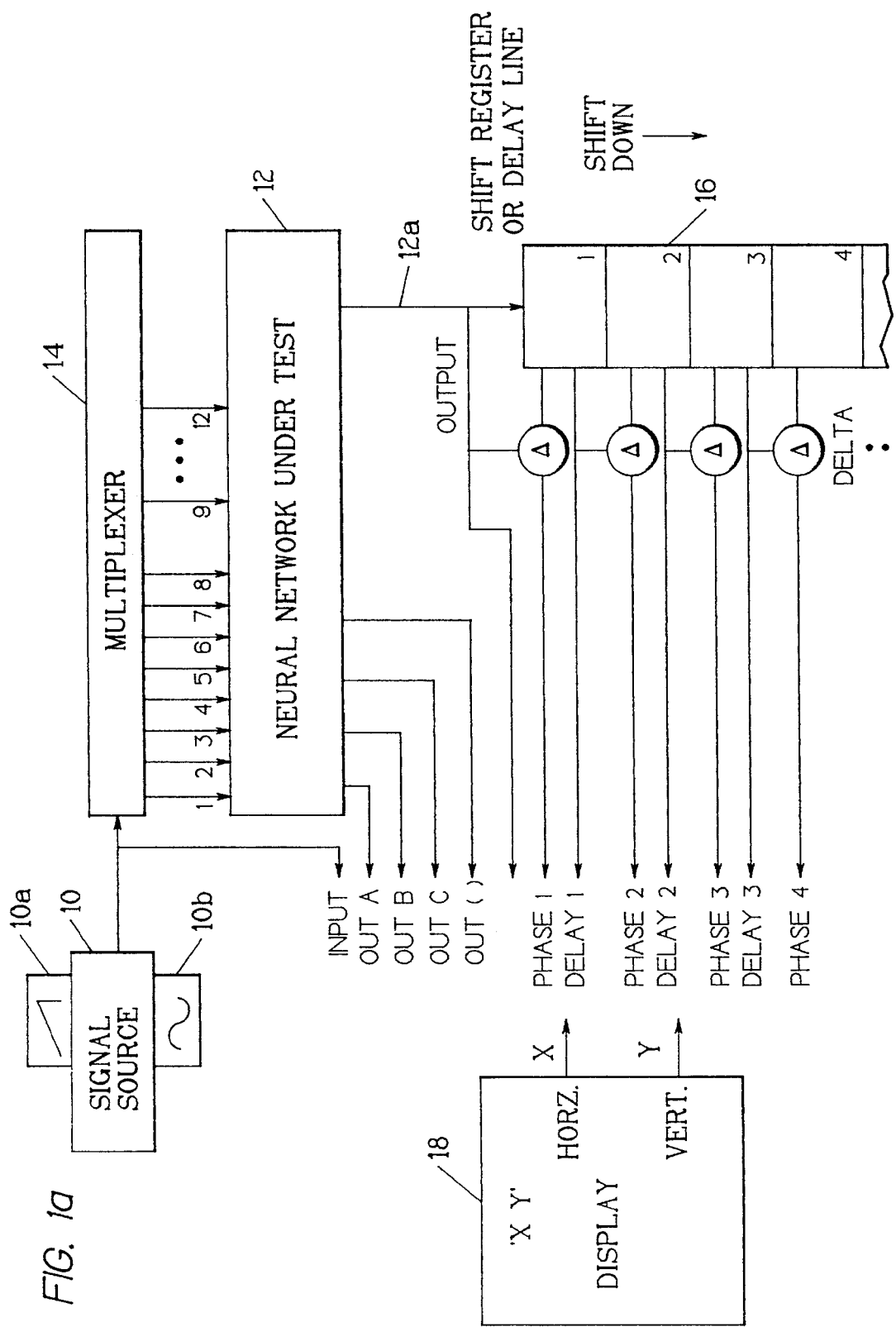
FIG. 1a is simplified block diagram of a first embodiment of a system for testing a neural network.
Figure 1B:
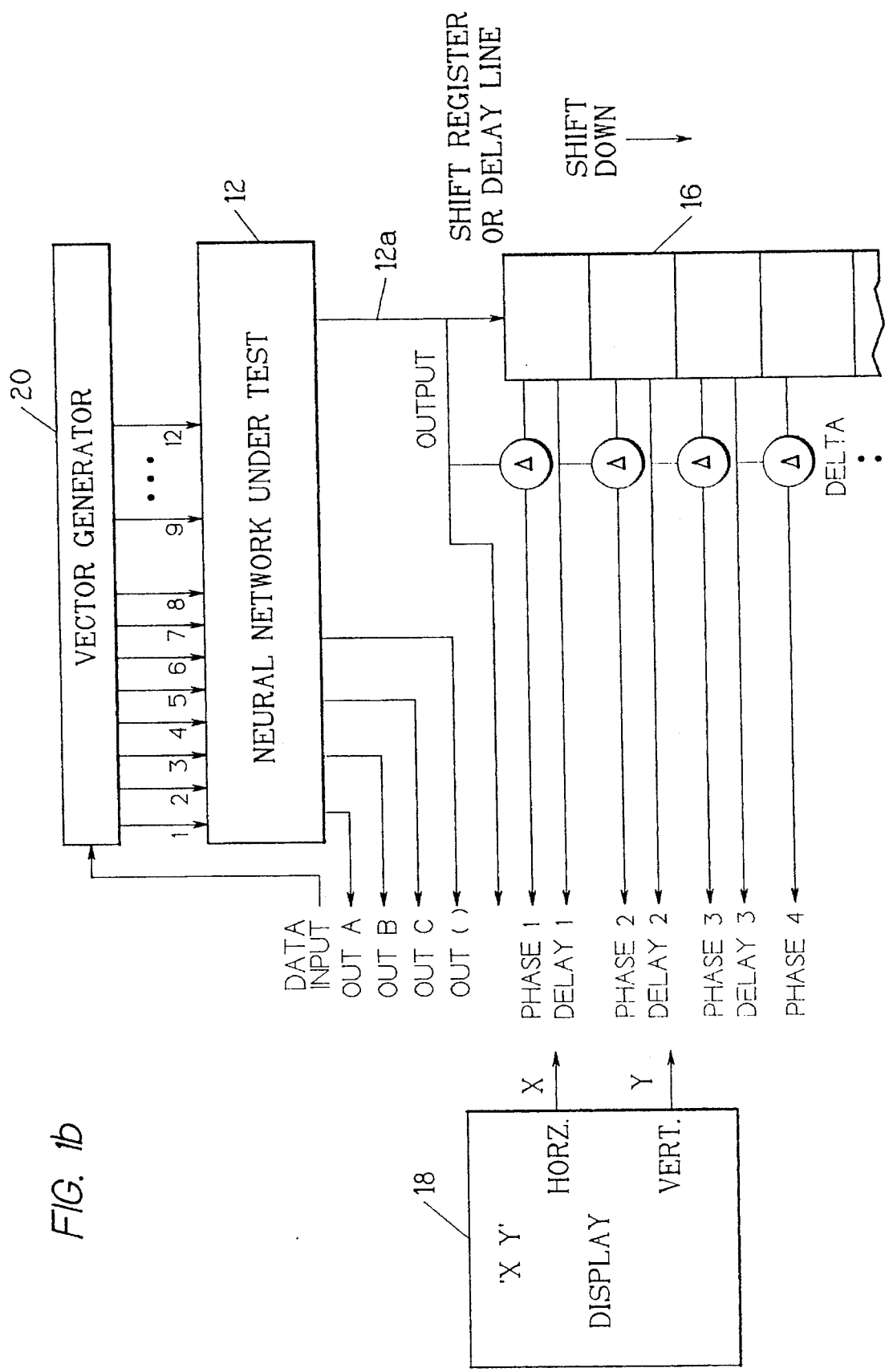
FIG. 1b is simplified block diagram of a second embodiment of a system for testing a neural network.
Figure 1C:
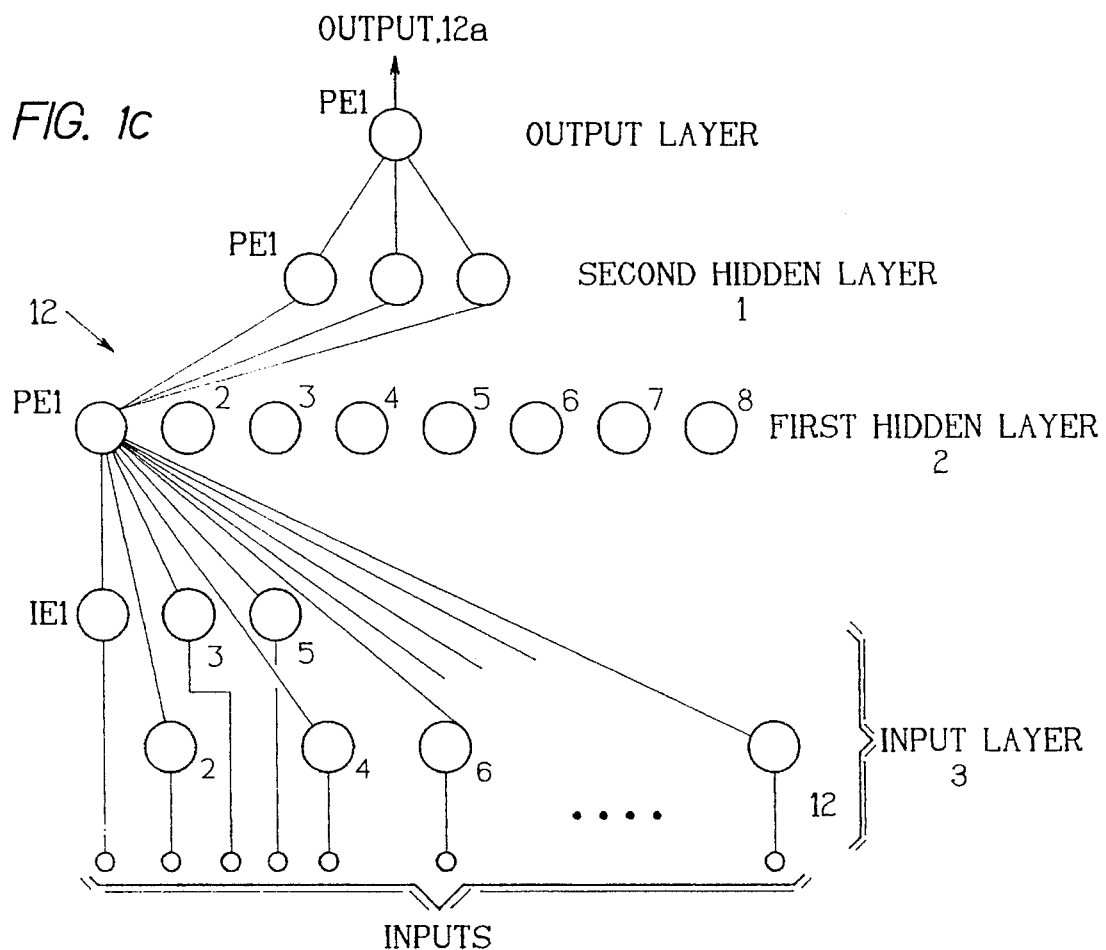
FIG. 1c illustrates an exemplary four layer neural network that is stimulated with test vectors by the systems of FIGS. 1a and 1b.

FIG. 1c illustrates an exemplary embodiment of a neural network 12, also referred to herein as the primary neural network. The neural network 12 is comprised of four layers designated as layer 0, the output layer; layer 1, the second hidden layer; layer 2, the first hidden layer; and layer 3, the input layer. Layer 0 has one neuron, or linear processing element (PE1), layer 1 has three nonlinear PEs (PE1–PE3), layer 2 has eight nonlinear PEs (PE1–PE8), and layer 3 has 12 linear input elements (IEs). The IEs do not perform a signal processing function in the manner that the PEs of layers 0–2 perform signal processing. A specific PE is identified first by the layer in which it resides, and then by the PE number. For example, PE2 of the second hidden layer is designated as (1, PE2) or more simply (1, 2). All layers are fully populated, that is, each PE receives an input from each PE (or IE) in a lower layer and provides outputs to each PE in a higher layer. In FIG. 1c only the connectivity for (2, 1) is illustrated for simplicity, it being realized that PEs (2, 2) through (2, 8) are connected identically. The strength of each connection is generally determined by training which produces a representation of the training data. Each PE operates with a sigmoid that is a hyperbolic tangent function, wherein an input of minus infinity results in a minus one output and wherein an input of positive infinity results in a positive one output.

The primary neural network was initially trained on continuous examples of the Henon attractor until the neural network's output reached a correlation level greater than 0.95. However, there are no requirements that neural networks must be trained in a unique way. A neural network with any number of inputs, hidden layers, and output processing elements can be tested using the disclosed metric. As such, the specific neural network topology illustrated in FIG. 1c is exemplary, and is not to be read in a limiting sense upon the practice of the invention.

As seen in FIG. 1a, the neural network 12 "under test" is connected to a signal source 10 via a multiplexer 14 that is coupled to the twelve inputs of the neural network. Any inputs not being driven by a signal are grounded by the multiplexer 14. A neural network 12 output 12a is connected to a delay line or shift register 16, where the differences of adjacent time delays become signals referred to herein as "phase". By example, the signal produced by the difference between the output 12a and the first delayed output is referred to as "phase 1", the difference between the first delayed output and the second delayed output is referred to as "phase 2", and so on. The first delayed signal is referred to as "delay 1" the second delayed signal is referred to as "delay 2", and so on. The number of delay stages, or taps, is preferably at least equal to the number of inputs to the neural network 12. The outputs labeled "out A" to "out ()" are optional additional outputs of the neural network 12.

A display device 18, such as a plotter or an oscilloscope, has horizontal and vertical (X, Y) inputs which are connected as described below so as to visually display an image that represents the response of the neural network 12 to the inputs provided by the multiplexed signal source 10. In other embodiments of the invention, wherein a virtual image is processed by a digital data processor, the display device 18 may be dispensed with, and replaced instead by the data processor that compares the neural network response to a stored table of expected responses.

Figure 1D:
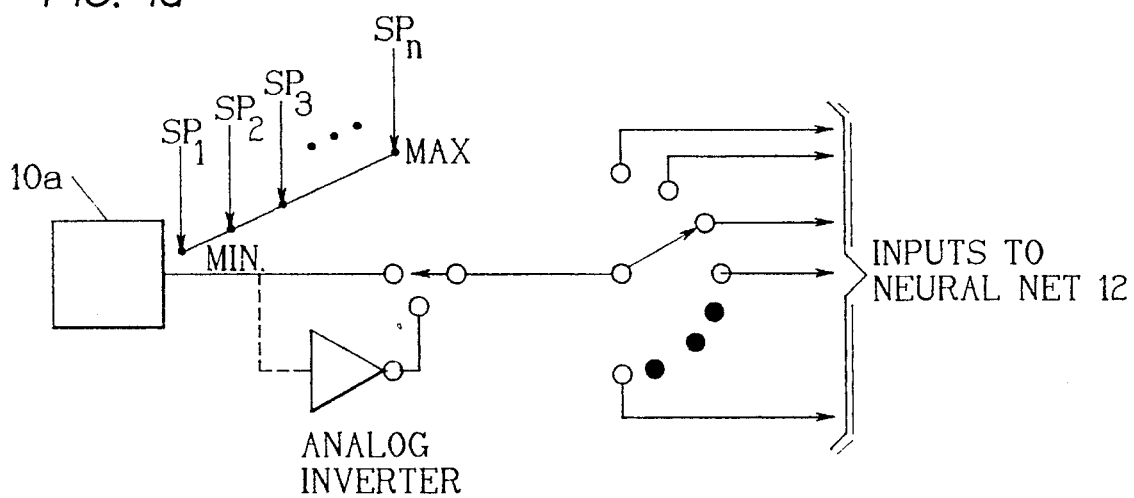

One input signal source 10a is programmed to linearly ramp up from a minimum (MIN) value, such as zero volts, to a specified maximum (MAX) value. As is illustrated in FIG. 1d, the ramp is sampled at a number of sample points (SPs), each of which represents a one dimensional input vector. The multiplexer 14 operates to sequentially scan, in turn, the inputs to the neural network 12 so as to couple each neural network input to the same ramp potential. Optionally, the multiplexer 14 also couples each input to the opposite polarity of the ramp potential that is provided from an inverter (INV). The resulting output of the neural network 12 is stored within a stage of the analog shift register 16, which is shifted in conjunction with the operation of the multiplexer 14. After a given sample point, and optionally its inverse, is applied to each input of the neural network 12, the signal source 10a is incremented to a next higher potential and the process is repeated.

It should be realized that the signal source 10a is exemplary, and that any desired input signal function can be generated, such as the sinewave signal source 10b. Also by example, a triangular sawtooth waveform can be generated, and/or a bipolar input waveform, or a waveform having any complex shape. Preferably, the waveform shape, and the distance between sample points, are selected so as to obtain a detectable difference in the resulting image appearing on the display 18 for two successive input vectors.

FIG. 1a is a subset of the system shown in FIG. 1b, wherein FIG. 1a generates one dimensional input vectors, and wherein FIG. 1b employs an input vector generator 20 that produce one dimensional or multidimensional vectors when testing various neural network paradigms. That is, the vector generator 20 provides, in response to a data input, one or more potentials that are separately applied to the input layer of the neural network 12. The use of a multidimensional vector requires that the input elements of the neural network 12 be capable of simultaneously accepting a plurality of input potentials.

FIGS. 2–28 are examples of various images that are visualized by the display device 18. As will be described below, in FIGS. 2–28 nonlinear phase plots are generated with both the ramped and sine wave inputs. Examples of phase to phase plots are generated to demonstrate a lack of image offset caused by neural network thresholds, and to demonstrate that the displayed image retains a metric of the neural network threshold values. An example of a multiple output phase plot was generated, as was an example of the output 12 versus a delayed output. Examples of nonlinear transfer plots are generated with the display device 18 horizontal input connected to the output of the ramped signal source 10a and the vertical input connected to the neural network output 12a. The multiplexer 14 was set to a single neural network input. Examples of nonlinear transfer plots were generated with both the primary and the threshold neural networks. Nonlinear differential transfer plots are generated with the display device 18 horizontal input connected to the ramped signal source 10a. The input signal was multiplexed between two inputs of the neural network under test. The display device 18 vertical input was connected to the phase 1 output. Examples of the nonlinear differential transfer plots were generated with the threshold neural network, demonstrating the metric's sensitivity to the threshold, and without the image offset. It was found that an image with a reference of zero as part of its trace is more stable in its measurement.

For the unique case of a one input to one output neural network, nonlinear differential transfer plots can be applied. The input signal is a ramp of alternating sample pairs of values. The neural network's output is measured at the phase 1 output.

The technique taught by the invention was found to measure the deterministic nonlinearities of neural networks having one input and one output, multiple inputs and outputs, one input and multiple outputs, and multiple inputs and outputs. Neural networks of any size and number of hidden layers are amenable to being stimulated in accordance with the technique of the invention.

By employing various combinations of output, phase, delay, display gain and input signals a metric is obtained for use in testing a trained neural network for conformance to a predetermined set of one or more operational characteristics, and/or for specifying the operational characteristics of a neural network. A simple, low accuracy neural network may be tested with only one image, whereas more complex neural networks may require a plurality of images.

An important aspect of the invention is that the neural network under test need not be stimulated with data from the training set of data with which the network was originally trained.

The various image plots illustrated in FIGS. 2–28 are examples of the application of the metric of the invention. In these Figures, the four captions associated with the individual Figures are as follows:

upper left: the gain of the display device 18, upper right: the two output signals that produced the phase plot, lower right: the maximum (MAX) input value to the neural network 12 that corresponds to the end point of a trace (if inside the plots' boundaries), and lower left: the neural network reference, or connection weight file.

Figure 2:
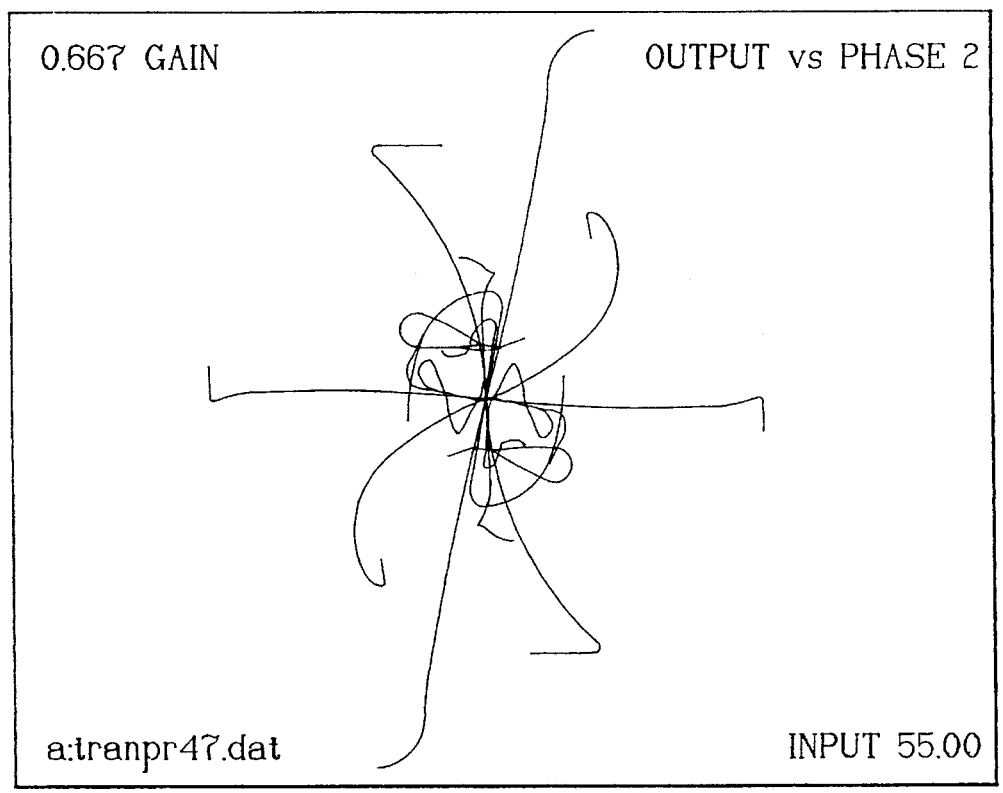
FIGS. 2–28 are representative waveforms showing the output of a neural network under test.

Specifically, FIG. 2 shows an output 12a versus phase 2 plot and illustrates a representation of the nonlinearities of the primary neural network. The spatial positions of the individual traces is a signature of the neural network 12 deterministic features. Different test configurations result in a radically different "view" of the same features. The plot of FIG. 2 is the composite result of the excursion of the ramp signal source 10a from zero to a maximum value (55). Each point of the image represents a result of a given input vector applied to an $i^{th}$ input of the neural network 12 (x-axis), and the resulting value of phase 2 (y-axis), wherein phase 2 is the value of the difference between the output 12a for a stimulation of the (i-1) and the (i-2) inputs. By example, if the sixth input is being stimulated, the point is plotted at x equal to the value of the output 12a, and y equal to the difference between the value of the output 12a for a previous stimulation of inputs five and four, which are stored in stages 1 and 2, respectively, of the shift register 16.

Figure 3:
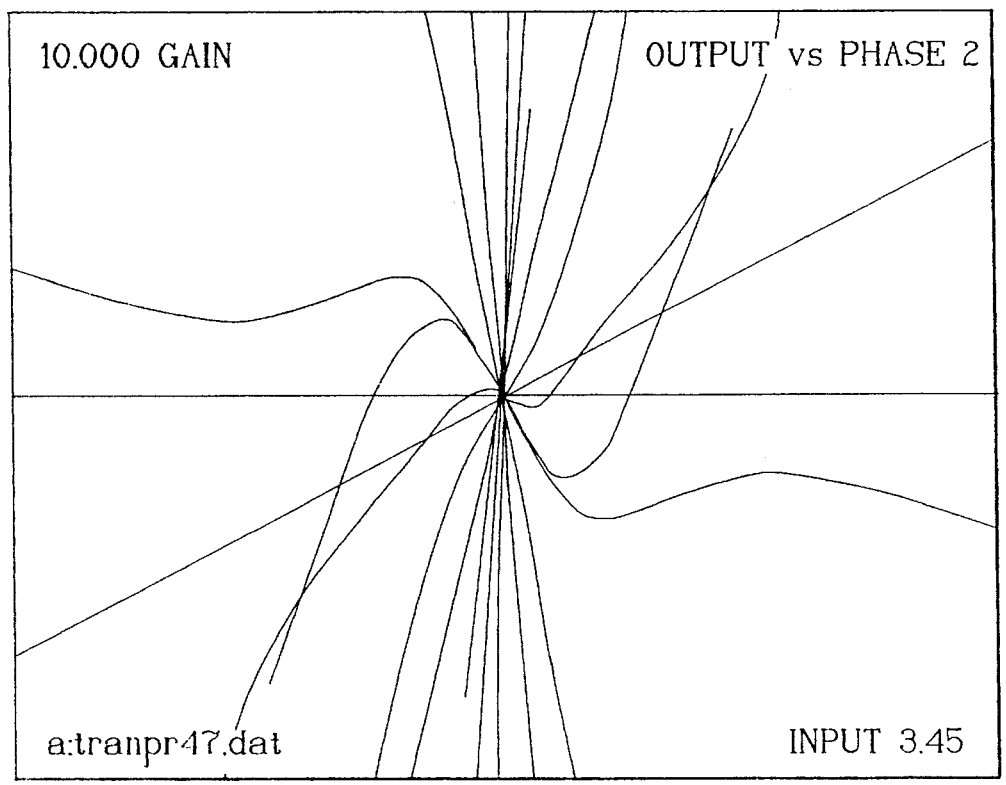
Figure 4:
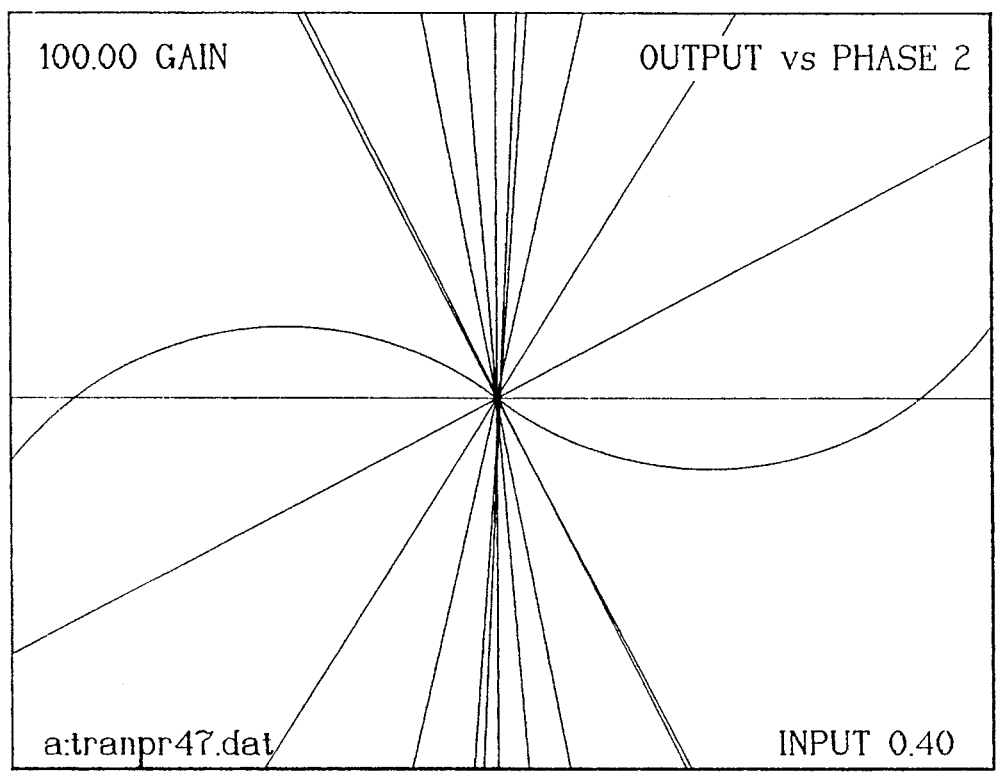

FIGS. 3 and 4 each show a portion of FIG. 2 at a higher gain, 10 and 100, respectively, and illustrate the fine structure of the nonlinearities.

Figure 5:
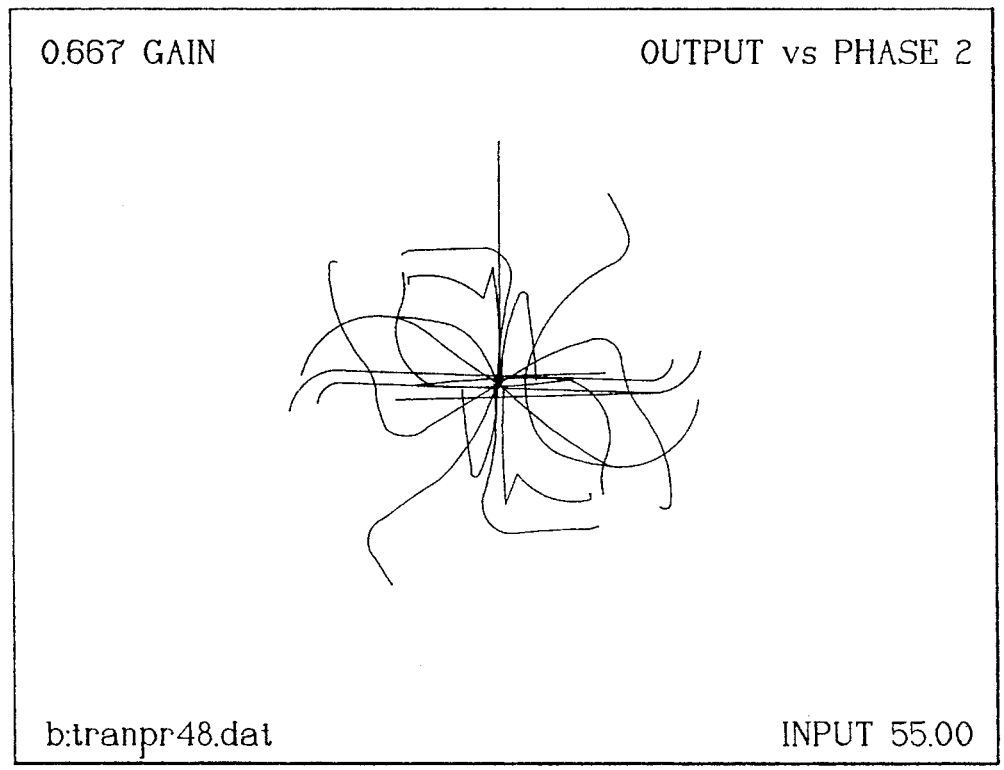

FIG. 5 is a phase plot of the secondary neural network, and is provided to show that different neural networks produce significantly different nonlinear spatial images.

Figure 6:
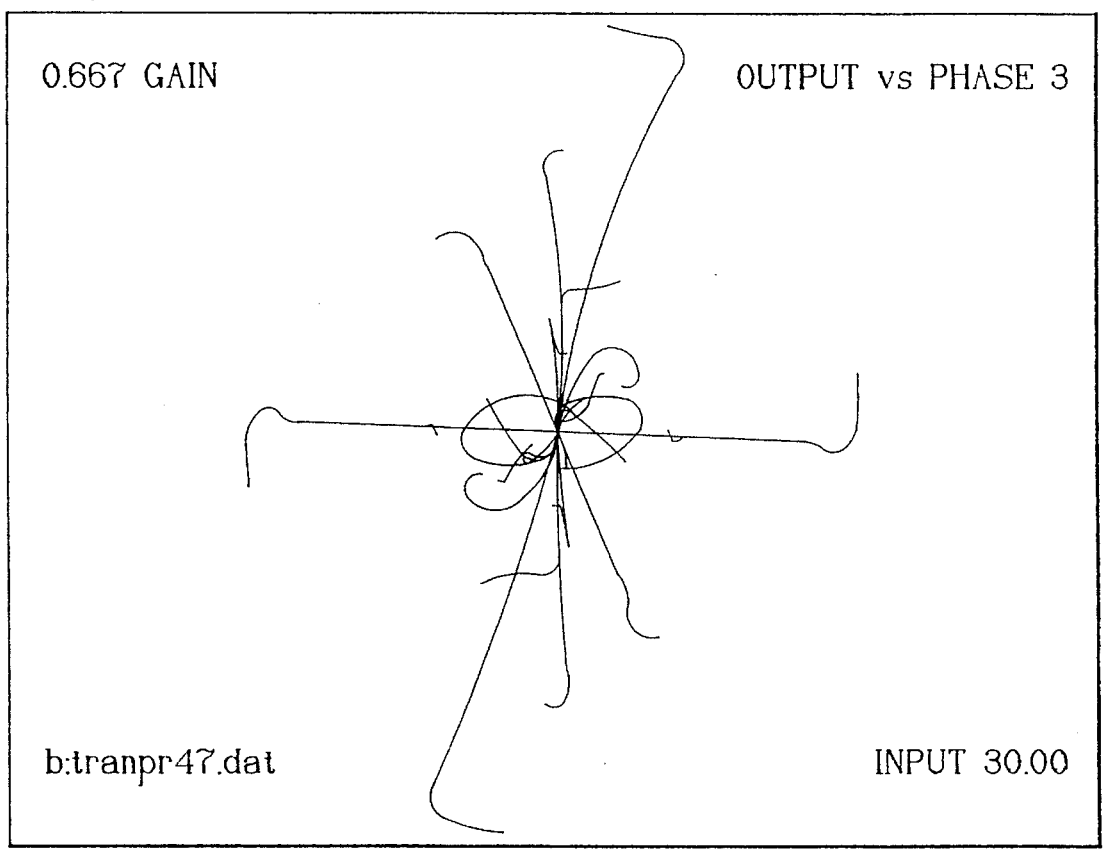

FIG. 6 is a phase plot showing that the same neural network deterministic features produce an image that appears to be rotated in space when generated by another phase. Examples of this rotation are shown in FIGS. 7, 8, and 9.

Figure 7:
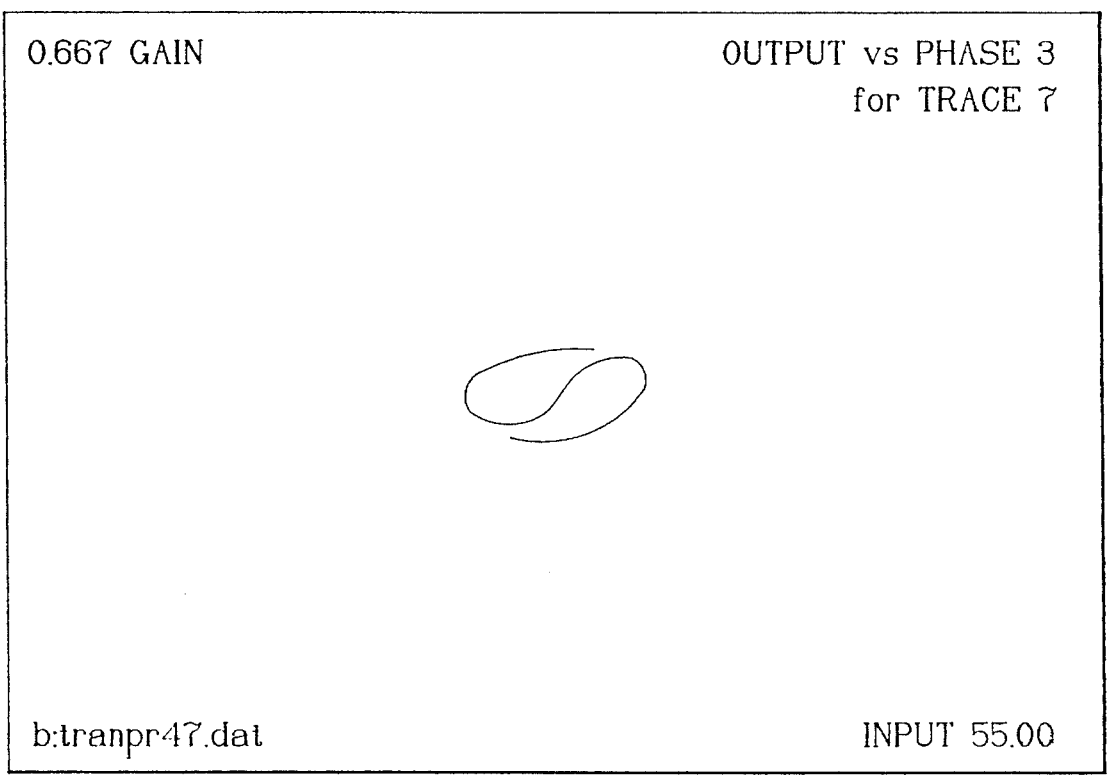

The image of FIG. 7 is a component of FIG. 6. Trace 7 is produced when input 7 of the neural network 12 is excited, and is compared against the output when input 6 is excited. As such, the plot of FIG. 7 is generated by the multiplexer 14 operating between inputs 6 and 7 of the neural network 12. The image of FIG. 7 can also be seen in the composite image of FIG. 6, as both images are generated using phase 3.

Figure 8:
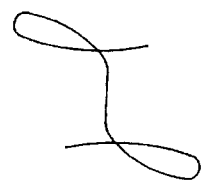

The image of FIG. 8 is a component of FIG. 2. It should be noted that, in the comparison of FIGS. 7 and 8, the images appear to be different views of the same spatial image.

Figure 9:
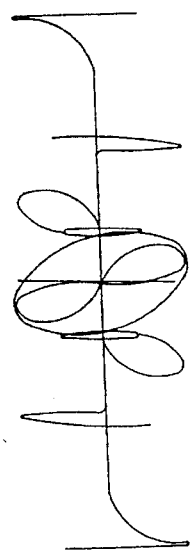

FIG. 9 is a composite phase plot for trace 7 with each of the phases superimposed over one another. The images of both FIGS. 7 and 8 can be seen in the image of FIG. 9. Rotation is more obvious, and is similar to the "three dimensional image" of a circle of rotation produced by the phase plots of sin (wt) vs sin (wt+ theta), for various thetas. Rotation produced by the changes in phase distorts and hides part of the image in both cases of the circle and the nonlinear phase plots.

Figure 10:
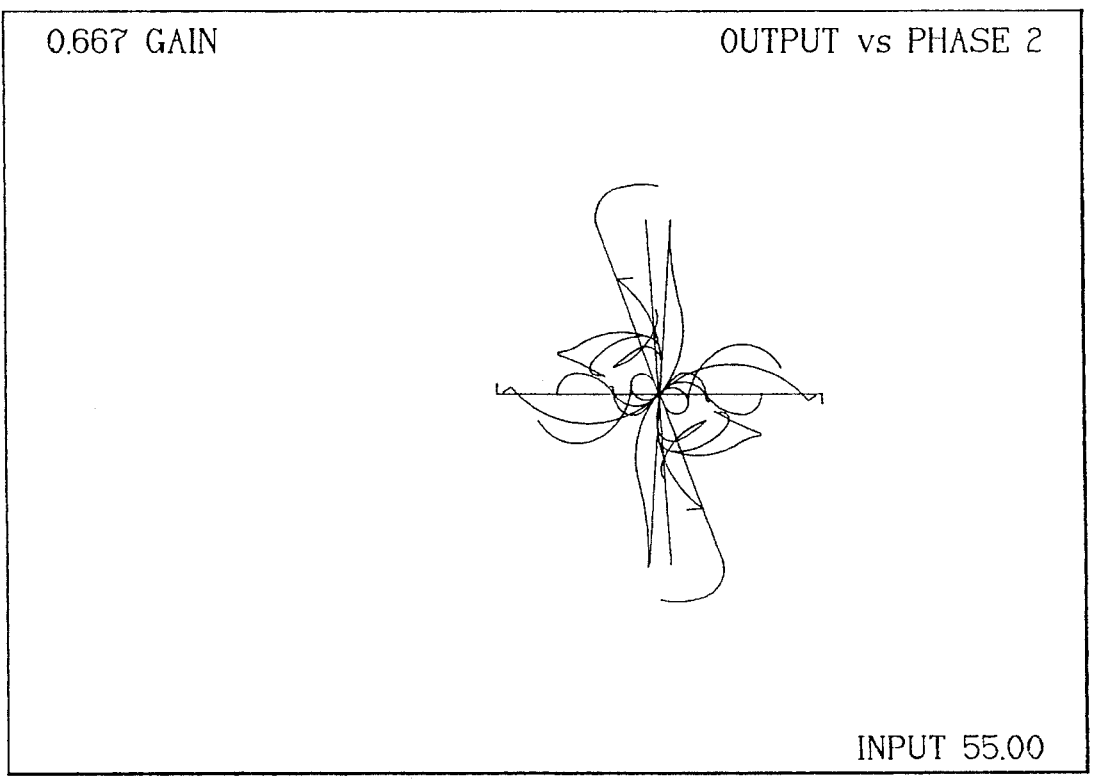

FIG. 10 is a phase plot of the neural network 12 with a threshold value in one of the PEs. It can be seen, when compared to FIG. 2, that the PE threshold produces an offset of the image and also changes the nonlinear signature of the image.

Figure 11:
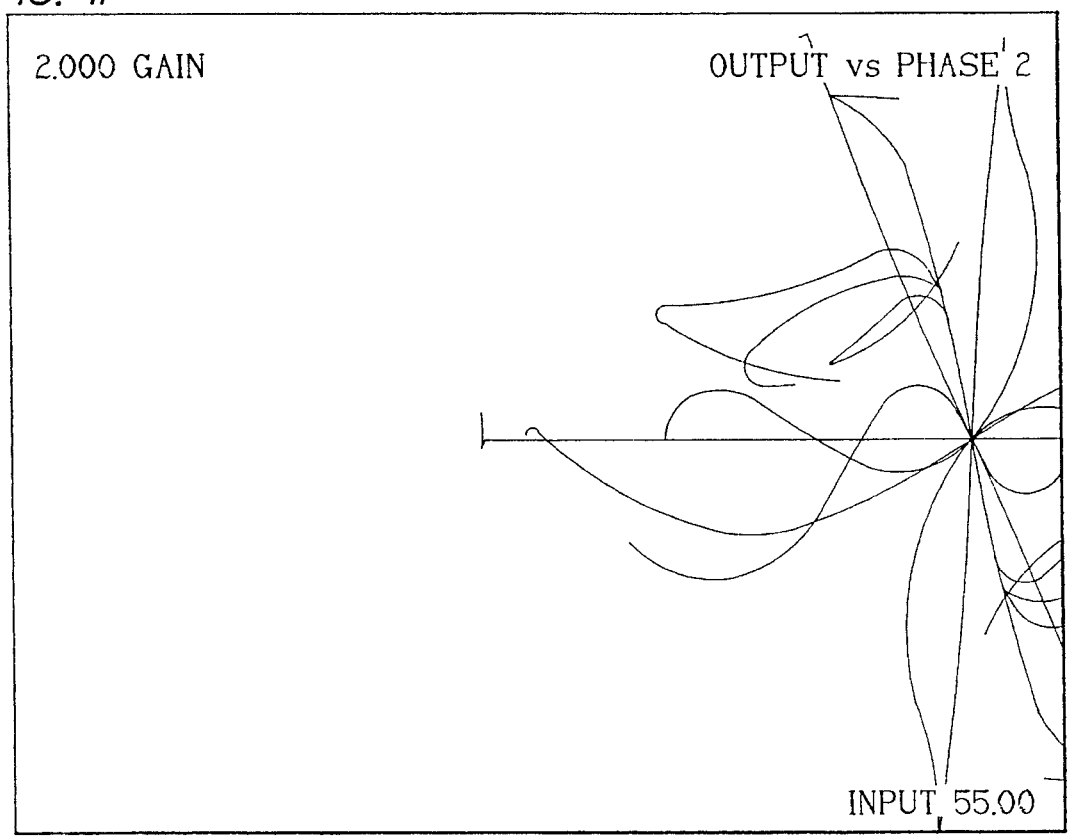

FIG. 11 shows that a small magnification of a threshold neural network may present a problem in representation. This problem is resolved by the metric developed for FIG. 13. The offset could be driven into a null by an external source, but the stability will always be less than a reference of zero.

Figure 12:
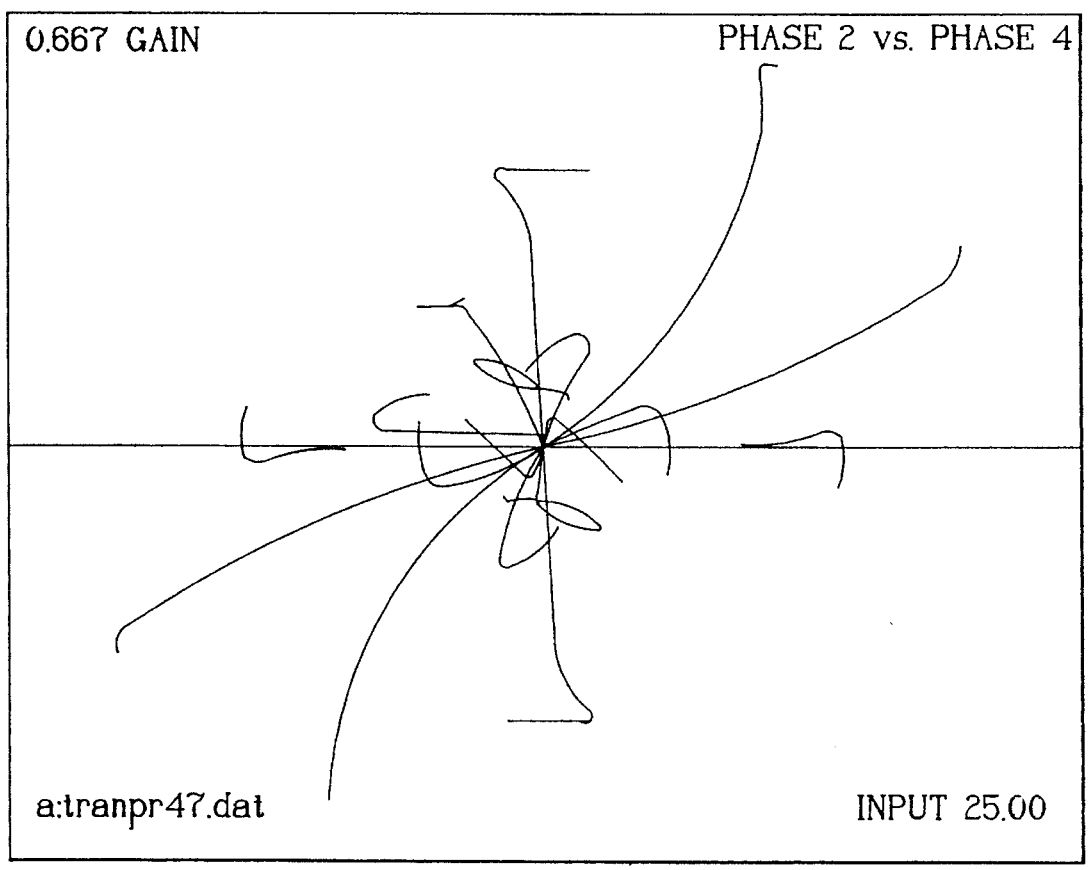
Figure 13:
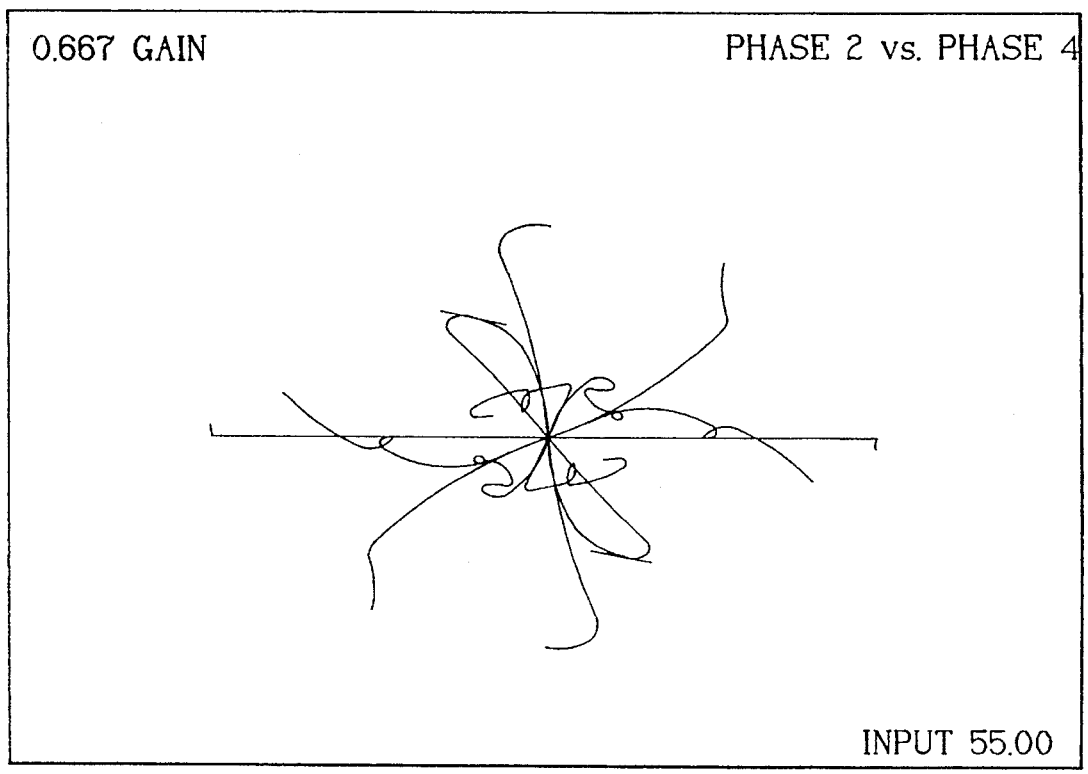

FIG. 12, a reference Figure for FIG. 13, is a phase plot showing a phase to phase measurement of the primary neural network. The change in signature relative to FIG. 2 shows another "view" of the neural network's nonlinear features. In particular, FIG. 12 is the same plot as is illustrated in FIG. 13, but without a threshold. Thus, any differences between FIGS. 12 and 13 are due to the presence of the threshold value.

Figure 14:
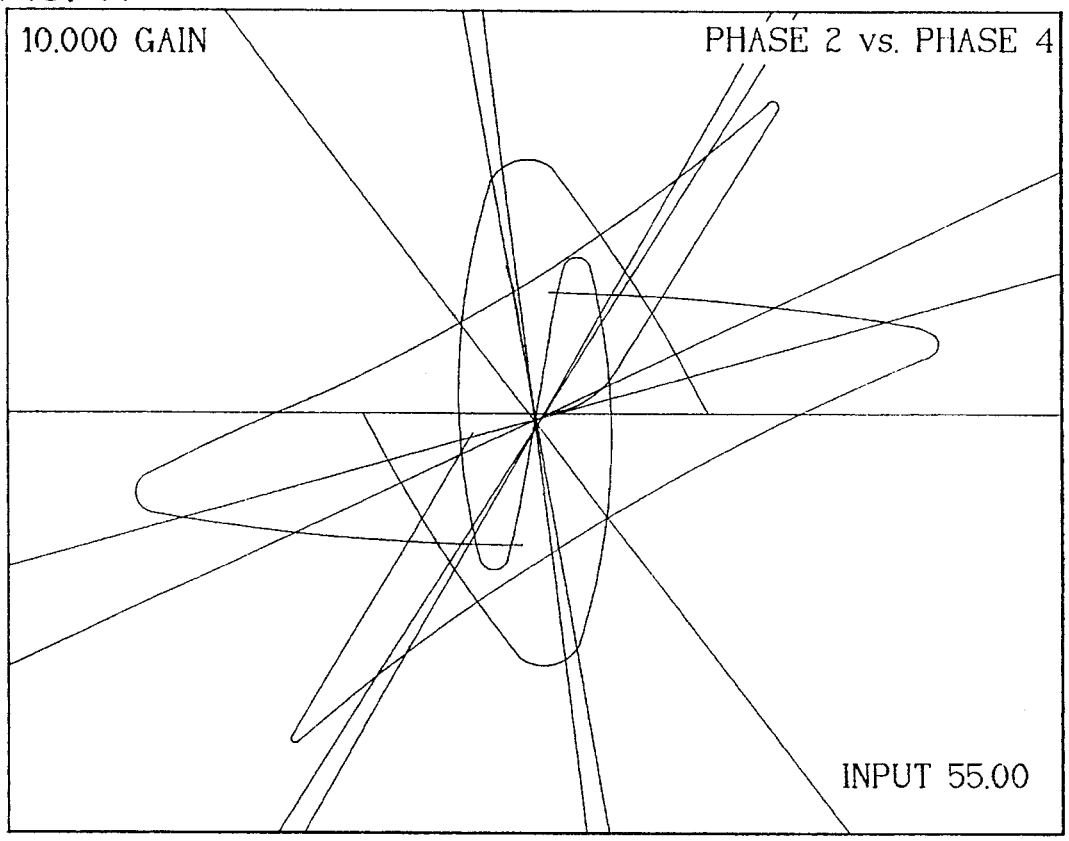
Figure 15:
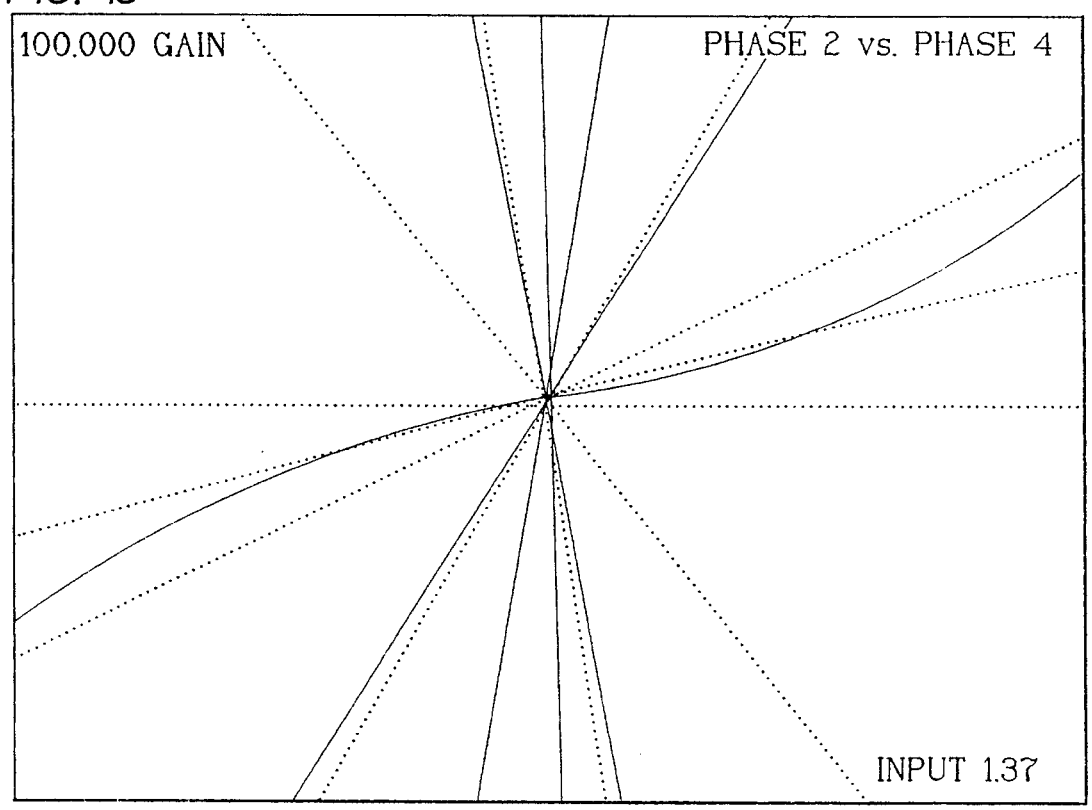

FIG. 13 is a phase plot of the threshold neural network. The offset is nulled and the metric retains the sensitivity of the measurement of the thresholds. The difference between FIGS. 12 and 13 clearly shows that the metric of the invention is sensitive to threshold changes, and may thus be employed to detect whether an offset value is correctly programmed into the neural network under test. FIG. 13, and FIGS. 14 and 15, illustrate that the neural network nonlinear features can be measured in a stable measurement. Specifically, FIG. 14 is the phase to phase plot of FIG. 13 with a gain of 10, and FIG. 15 is the phase to phase plot of FIG. 13 with a gain of 100.

Figure 16:
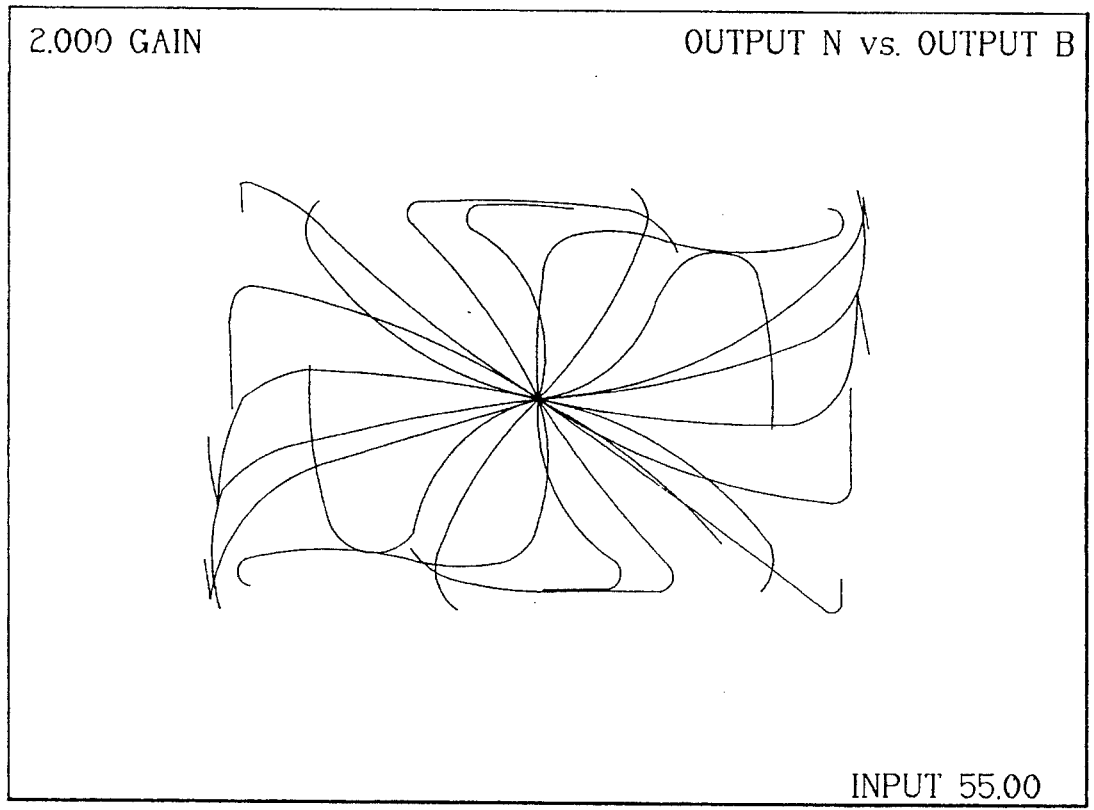

FIG. 16 is a phase plot showing, for a neural network having multiple outputs, that the outputs are deterministic to one other. Thus, if a threshold neural network is to be tested, image offsets can be eliminated by plotting phase 1A to phase 1B.

Figure 17:
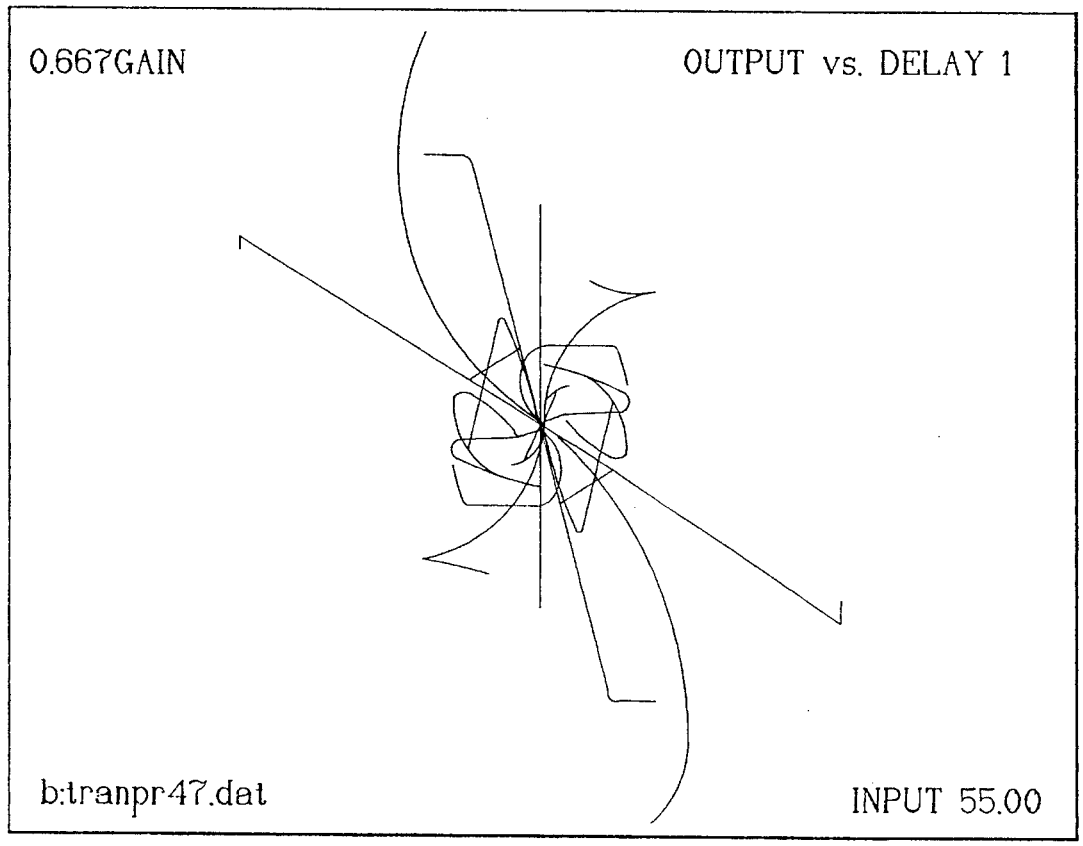

FIG. 17 is a plot showing the output 12a versus delay 1, and illustrates the nonlinear deterministic characteristics between the output 12a and the delayed output.

Figure 18:
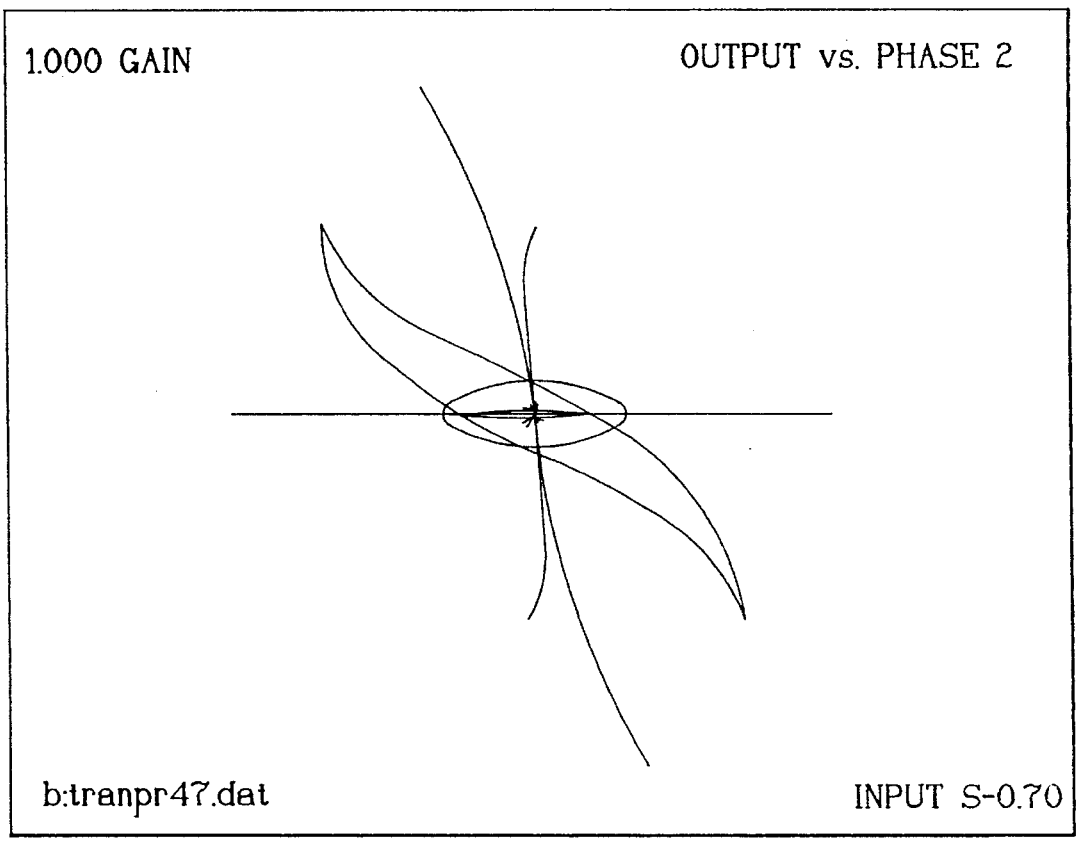

FIG. 18 is a phase plot showing that deterministic nonlinear images can be produced when another input signal is used. To produce the plot of FIG. 18 the input signal was a constant amplitude sine wave obtained from source 10b.

Figure 19:
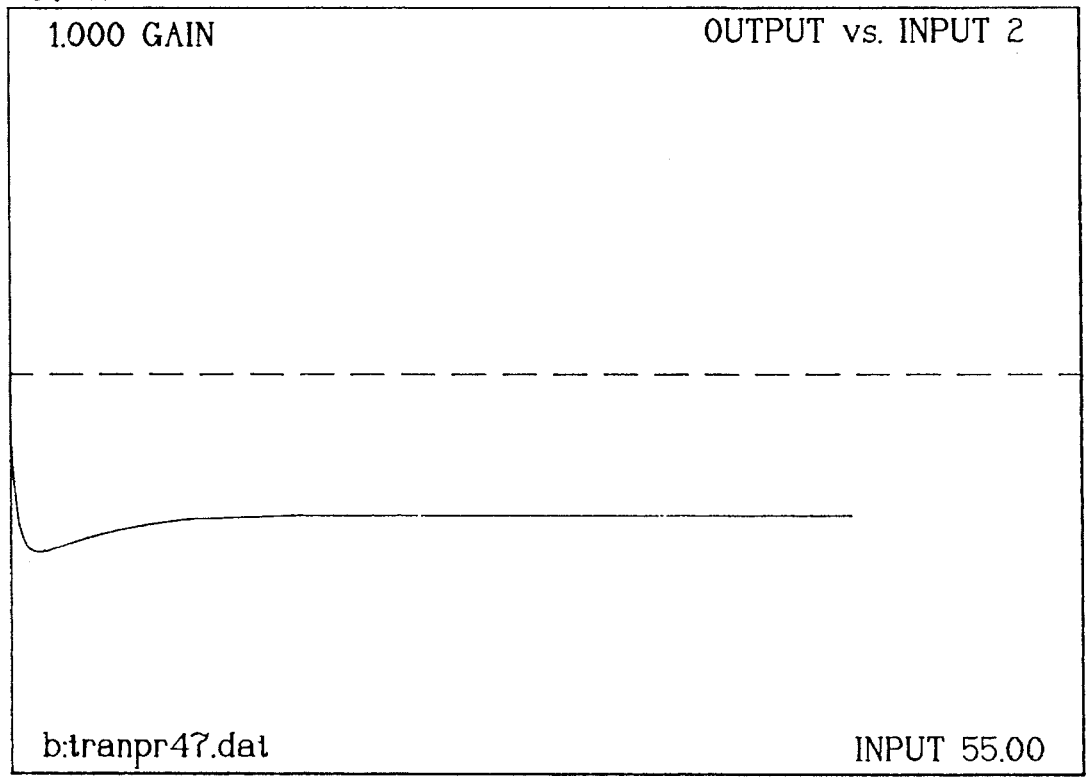
Figure 20:
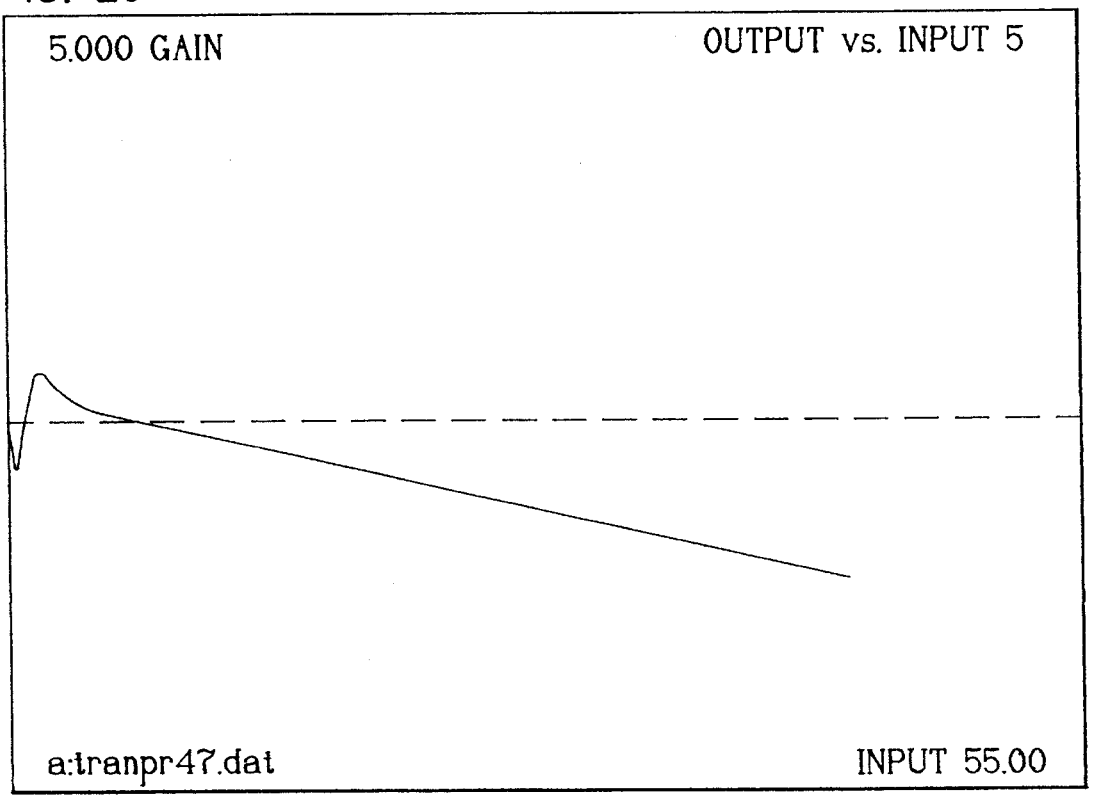
Figure 21:
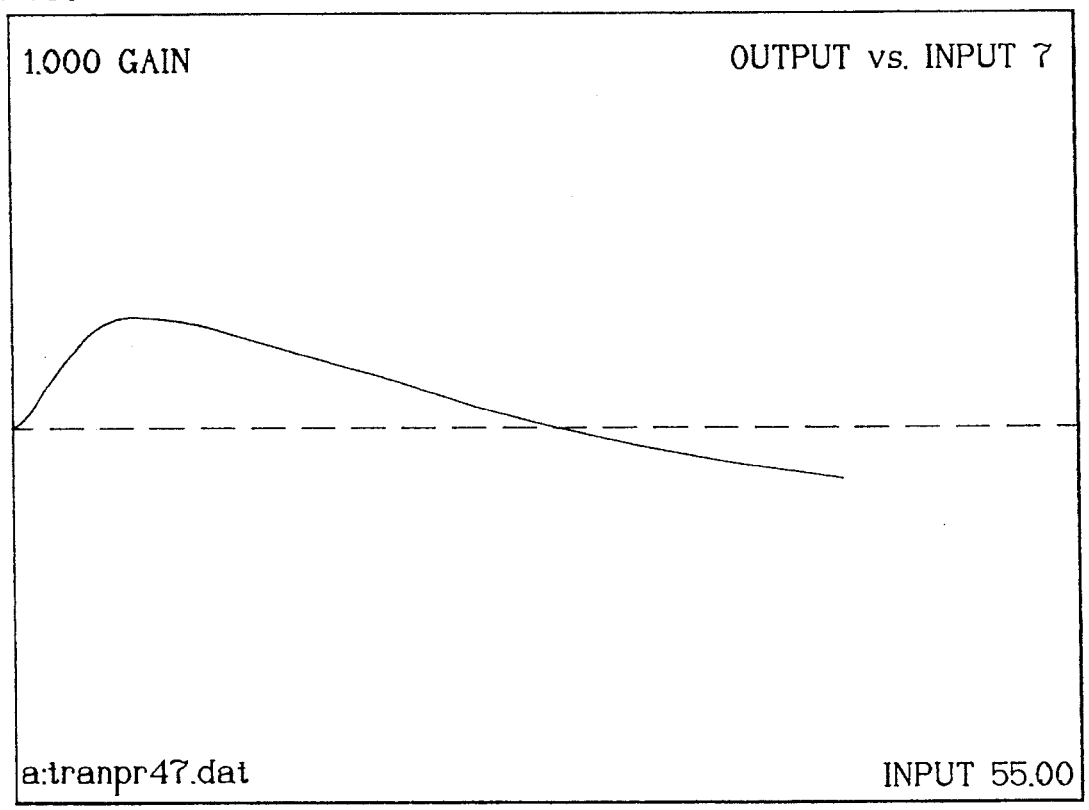

FIG. 19, and FIGS. 20 and 21, are nonlinear transfer plots of various inputs of the primary neural network. The horizontal position of all transfer plots is a linear proportion of the input signal. Zero is at the most left edge of the plot.

FIG. 20 is a nonlinear transfer plot of input 5. The output signal goes through three zero values and changes polarity.

FIG. 21 is a nonlinear transfer plot of input 7.

Figure 22:
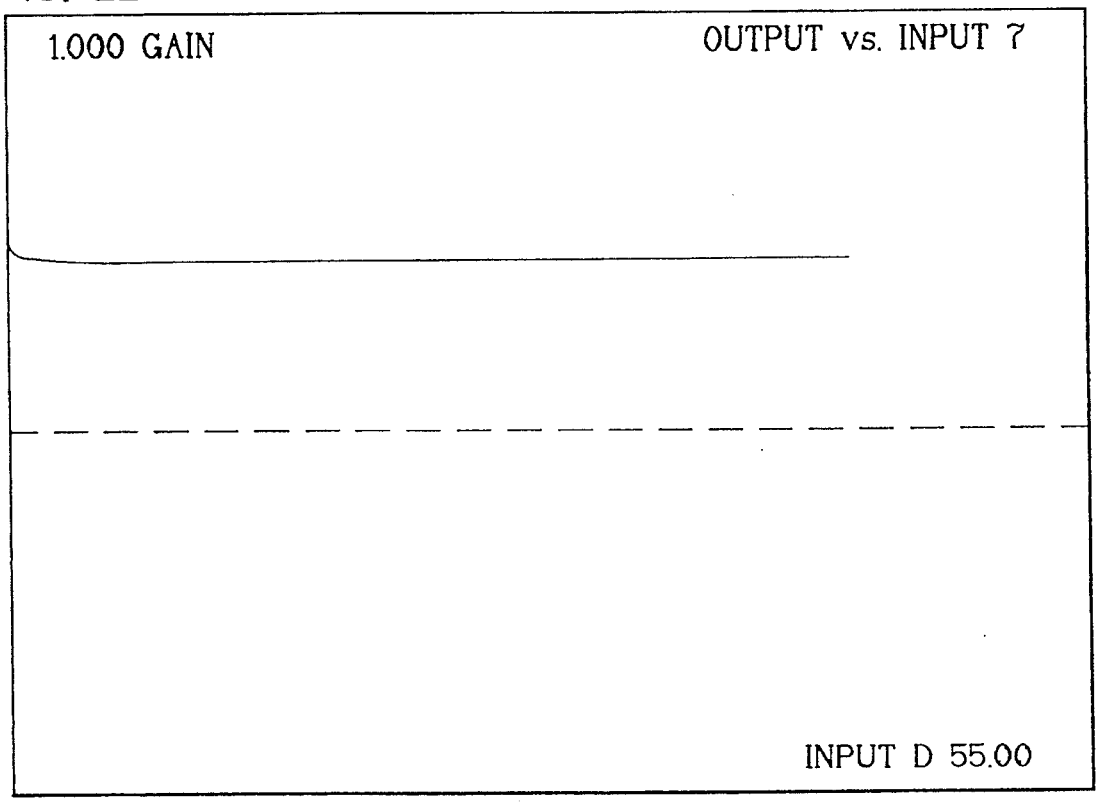
Figure 23:
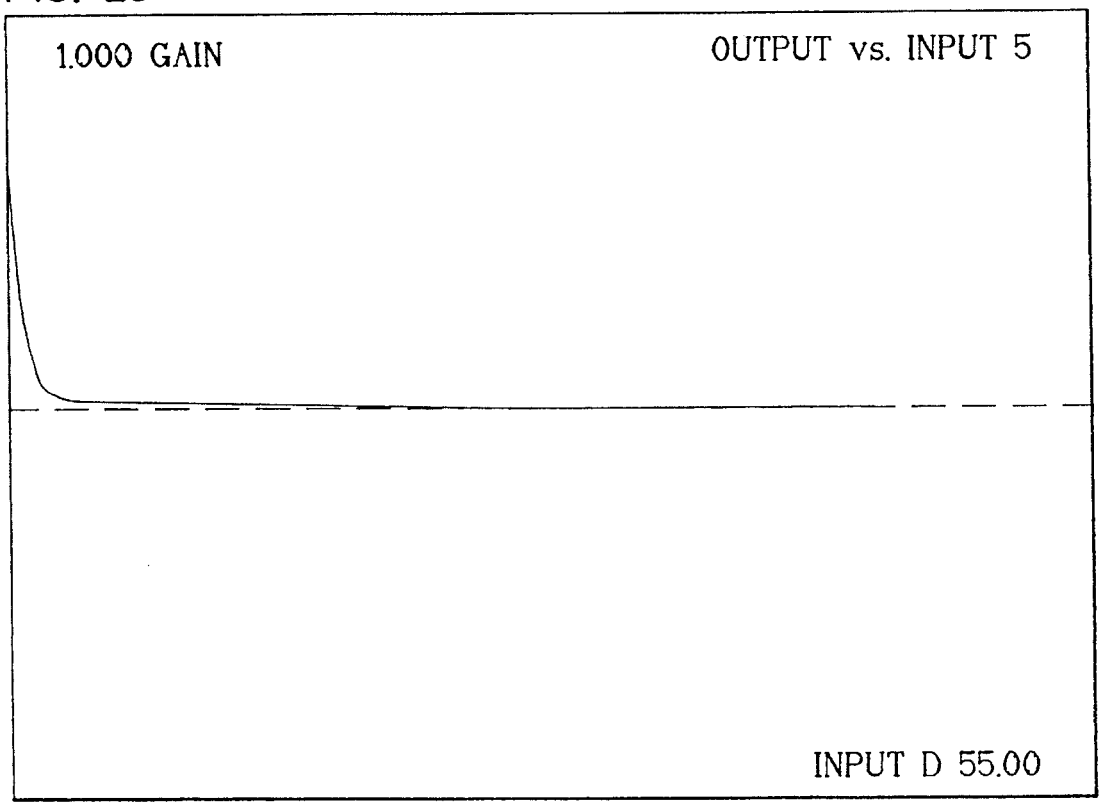
Figure 24:
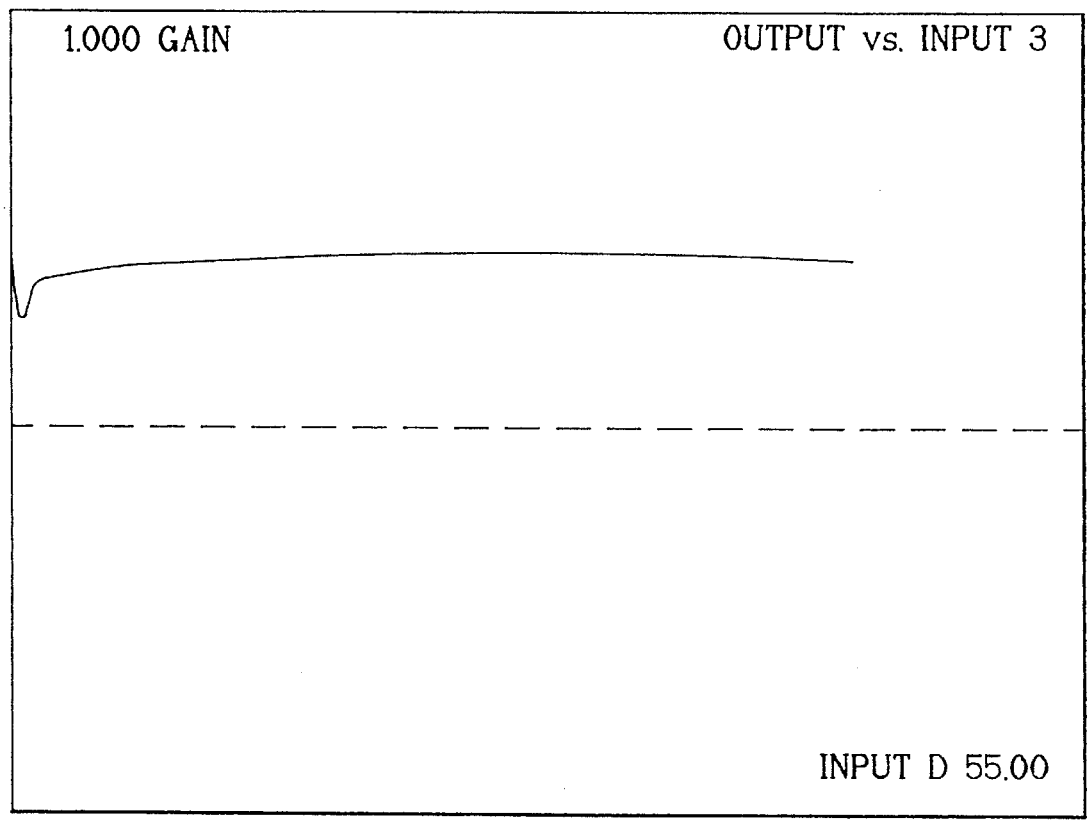

FIG. 22 is a nonlinear transfer plot of input 7 of the threshold neural network. FIG. 22, and also FIGS. 23 and 24, are examples of different input excitations. It should be noted that the waveforms do not have a stable reference of zero for one specific point of the plot.

FIG. 23 is a value transfer plot of input 5 (threshold neural network).

FIG. 24 is a nonlinear transfer plot of input 3 (threshold neural network).

Figure 25:
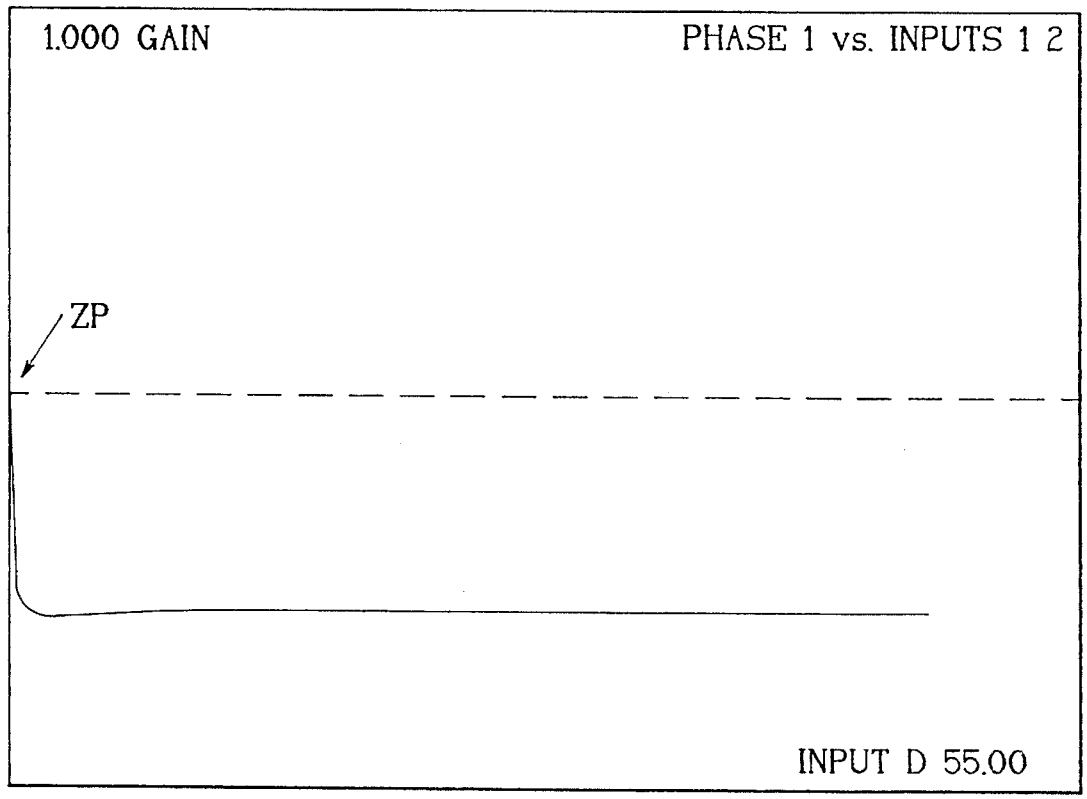

FIG. 25 is a nonlinear differential transfer plot of inputs 1 and 2 of the threshold neural network. This Figure, and also FIGS. 26 and 27, show that all traces can be referenced to at least one specific zero point (ZP) in each plot.

Figure 26:
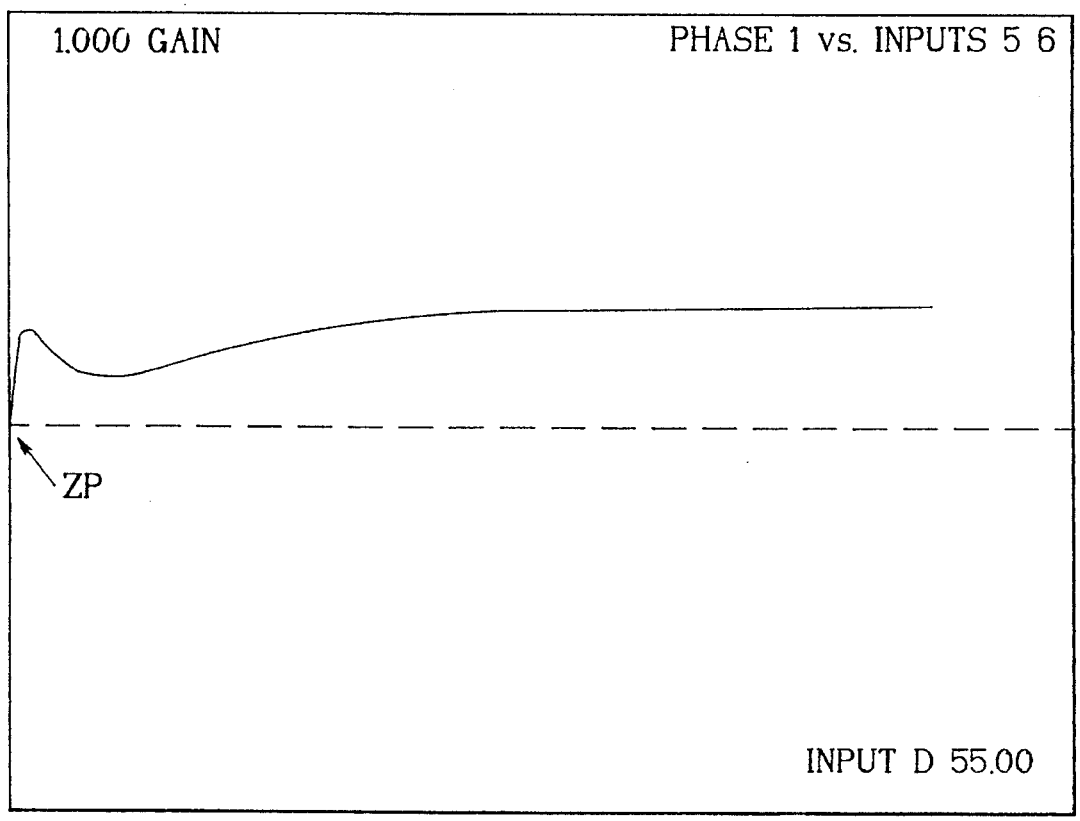

FIG. 26 is a nonlinear differential transfer plot of inputs 5 and 6.

Figure 27:
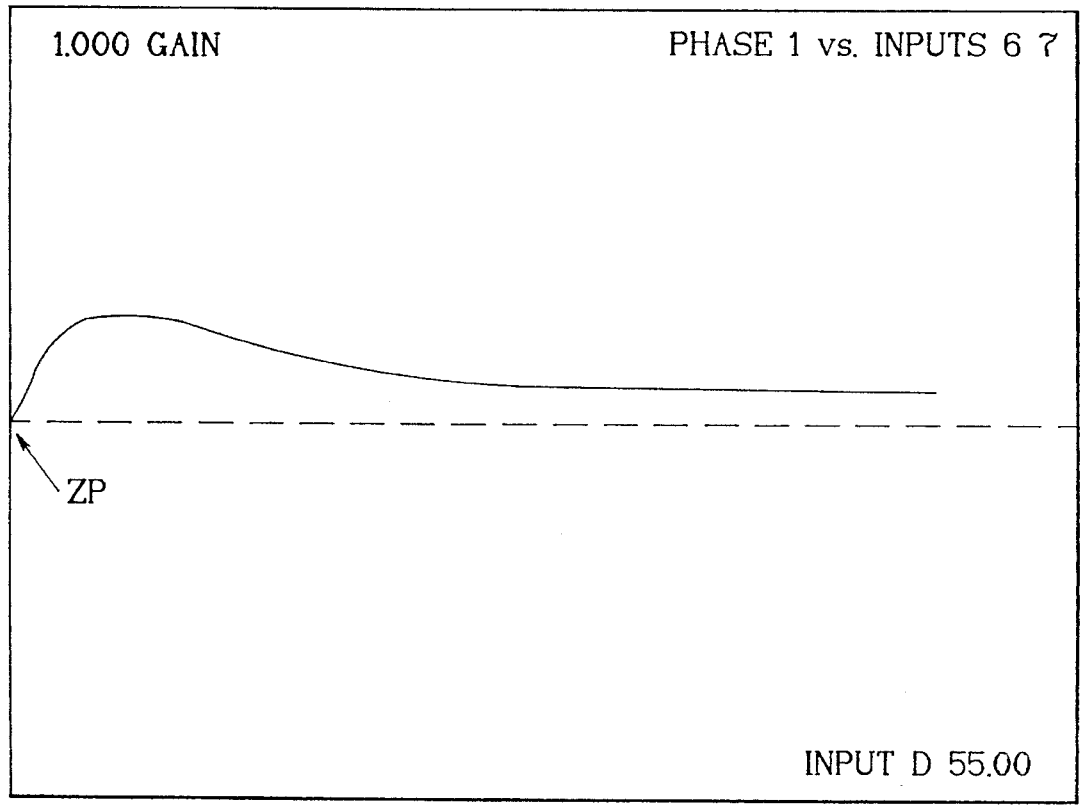

FIG. 27 is a nonlinear differential transfer plot of inputs 6 and 7.

Figure 28:
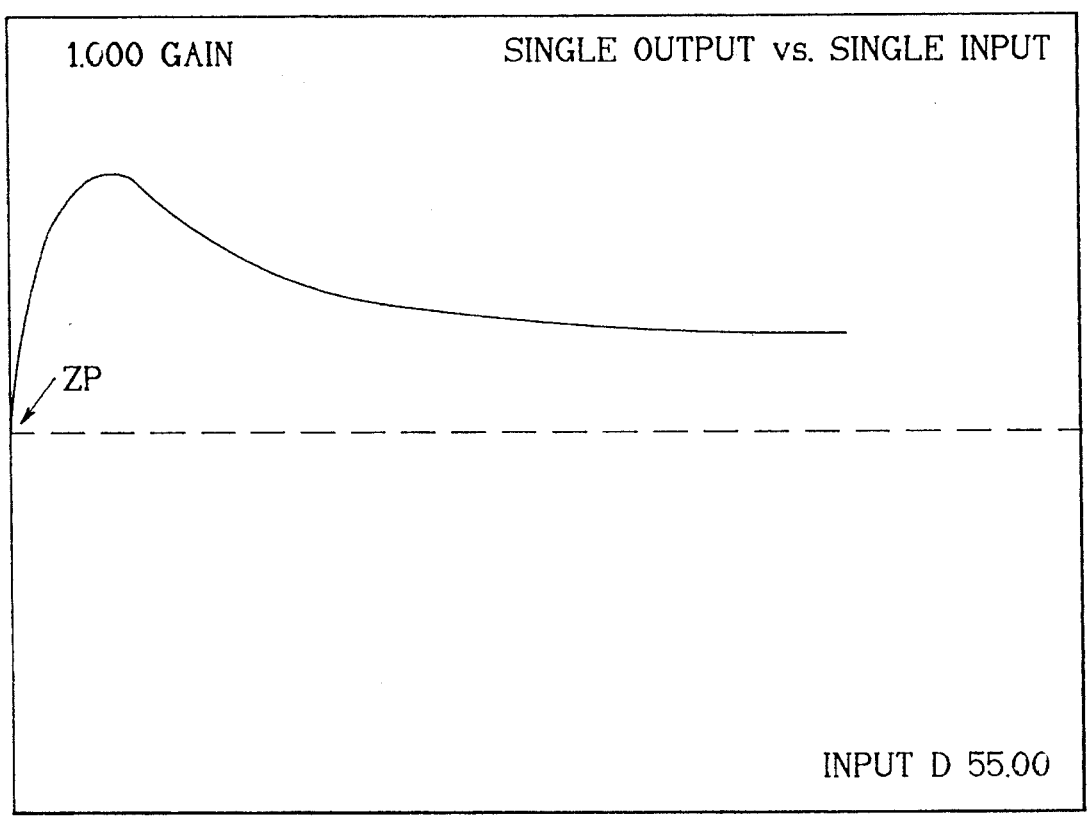

FIG. 28 is a nonlinear differential transfer plot of a single input and a single output neural network, specifically the threshold neural network used with only one input. The horizontal axis is the absolute magnitude of the input signal, while the vertical axis is the difference between two consecutive alternating polarities of the input signal. As before, ZP is the zero point.

In summary, the metric of the invention provides an efficient method of testing neural networks. The plots of FIGS. 2–28 show a deterministic representation of the neural network's internal nonlinear features and the structure of these features. The metric is sensitive to changes in the neural network's components, such as connection values, threshold (offset) values, and nonconformance of the required nonlinearities.

Depending upon the required accuracy, the neural network could be tested with a single deterministic plot. Manufacturers of neural network integrated circuits, such as those that can shift test weights into the circuit, can employ the metric to perform quality testing for grading and acceptance. The ideal test image for quality testing is a circle which can be readily sensed for its statistical purity. As such, a set of connection weights are predetermined such that, when a particular set of input vectors are applied, the resulting displayed image has a shape that is readily identified as being in conformance with an expected image.

While the invention has been particularly shown and described with respect to preferred embodiments thereof, it will be understood by those skilled in the art that changes in form and details may be made therein without departing from the scope and spirit of the invention.

What is claimed is:

1. A computer-implemented method of testing a neural network, comprising a set of processing nodes interconnected by a plurality of interconnecting links in a sequence of layers from an input layer to an output layer, each processing node receiving an input signal over each interconnecting link connected thereto and generating a nodal output signal in response thereto and further in response to a respective connection weight value, nodal output signals from processing nodes in the output layer comprising a neural network output, in relation to a reference represented by a reference image, the method comprising the steps of:

stimulating at least one processing node of the input layer of the neural network with an input vector comprising at least one input signal to obtain output signals from processing nodes at the output layer of the neural network;

obtaining a plurality of samples of the output signals, wherein at least one of the plurality of samples is delayed in time from another one of the samples;

generating an image from the plurality of samples; and comparing the image to the reference image to determine an operational characteristic of the neural network.

2. A method as set forth in claim 1 wherein the at least one of the plurality of samples represents a difference between two samples.

3. A method as set forth in claim 1 wherein the step of generating generates an image comprising a plurality of points, and wherein each of the points represents a value of the output signal resulting from the application of the input vector to one of the inputs of the neural network.

4. A method as set forth in claim 1 wherein the step of generating generates an image comprising a plurality of points, wherein each of the points is referenced to an x-y coordinate system, wherein a distance along the x-axis is a function of a value of the output of the neural network for a given input vector applied to a first input of the neural network, and wherein a distance along the y-axis is function of a value of the output of the neural network for the given input vector applied to a second input of the neural network.

5. A method as set forth in claim 1 wherein the step of stimulating includes the steps of:

generating an input signal having a voltage potential whose value varies with time; and successively applying a given value of the time varying voltage potential to each of the inputs of the neural network.

6. A computer-implemented method of testing a neural network, comprising a set of processing nodes interconnected by plurality of interconnecting links in a sequence of layers from an input layer to an output layer, each processing node receiving an input signal over each interconnecting link connected thereto and generating a nodal output signal in response thereto and further in response to a respective connection weight value, nodal output signals from processing nodes in the output layer comprising a neural network output, in relation to a reference represented by a reference image, the method comprising the steps of:

stimulating at least one input of the neural network with an input vector to obtain an output signal at an output of the neural network;

obtaining at least one sample of the output signal;

generating an image from the at least one sample of the output signal and from the input vector; and comparing the image to a reference image to determine an operational characteristic of the neural network.

7. A method as set forth in claim 6 wherein the at least one sample represents a difference between two samples.

8. A method as set forth in claim 6 wherein the step of generating generates an image comprising a plurality of points, and wherein each of the points represents a value of an output resulting from the input vector to one of the inputs of the neural network.

9. A method as set forth in claim 6 wherein the step of generating generates an image comprising a plurality of points, wherein each of the points is referenced to an x-y coordinate system, wherein a distance along the x-axis is a function of a value of the input vector, and wherein a distance along the y-axis is function of a value of the output of the neural network for the input vector.

10. A method as set forth in claim 6 wherein the step of stimulating includes the steps of:

generating an input signal having a voltage potential whose value varies with time; and successively applying a given value of the time varying voltage potential to each of the inputs of the neural network.

11. Apparatus for testing a neural network, comprising a set of processing nodes interconnected by a plurality of interconnecting links in a sequence of layers from an input layer to an output layer, each processing node receiving an input signal over each interconnecting link connected thereto and generating a nodal output signal in response thereto and further in response to a respective connection weight value, nodal output signals from processing nodes in the output layer comprising a neural network output, in relation to a reference represented by a reference image, comprising:

means for stimulating at least one processing node of the input layer of the neural network with an input vector to obtain output signals at one of said processing nodes of the output layer of the neural network;

means for obtaining a plurality of samples of the output signals, wherein at least one of the plurality of samples is delayed in time from another one of the samples;

means for generating an image from the plurality of samples; and means for comparing the image to the reference image to determine an operational characteristic of the neural network.

12. Apparatus as set forth in claim 11 and further including means for generating a difference between two samples.

13. Apparatus as set forth in claim 11 wherein said obtaining means comprises analog voltage storage means for storing a plurality of samples of the output of the neural network.

14. Apparatus as set forth in claim 11 wherein said generating means generates an image comprising a plurality of points, wherein each of the points is referenced to an x-y coordinate system, wherein a distance along the x-axis is a function of a value of the output of the neural network for a given input vector applied to a first input of the neural network, and wherein a distance along the y-axis is function of a value of the output of the neural network for the given input vector applied a second input of the neural network.

15. Apparatus as set forth in claim 11 wherein said stimulating means comprises:

means for generating a time varying voltage potential; and means for successively applying a given value of the time varying voltage potential to each of the inputs of the neural network.

16. Apparatus for testing a neural network, comprising a set of processing nodes interconnected by a plurality of interconnecting links in a sequence of layers from an input layer to an output layer, each processing node receiving an input signal over each interconnecting link connected thereto and generating a nodal output signal in response thereto and further in response to a respective connection weight value, nodal output signals from processing nodes in the output layer comprising a neural network output, in relation to a reference represented by a reference image, comprising:

means for stimulating at least one processing node of the input layer of the neural network with an input vector to obtain an output signal at one of the processing nodes of the output layer of the neural network;

means for obtaining at least one sample of the output signal; and means for generating an image from the at least one sample of the output signal and from the input vector; and means for comparing the image to the reference image to determine an operational characteristic of the neural network.

17. Apparatus as set forth in claim 16 and further including means for generating a difference between two samples.

18. Apparatus as set forth in claim 16 wherein said obtaining means comprises analog voltage storage means for storing a plurality of samples of the output of the neural network.

19. Apparatus as set forth in claim 16 wherein said generating means generates an image comprising a plurality of points, wherein each of the points is referenced to an x-y coordinate system, wherein a distance along the x-axis is a function of a value of the input vector, and wherein a distance along the y-axis is function of a value of the output of the neural network.

20. Apparatus as set forth in claim 16 wherein said stimulating means comprises:

means for generating a time varying voltage potential; and means for successively applying a given value of the time varying voltage potential to each of the inputs of the neural network.

* * * * *